United States Patent
Korenstein et al.

(10) Patent No.: US 8,698,161 B2
(45) Date of Patent: Apr. 15, 2014

(54) SEMICONDUCTOR STRUCTURES HAVING DIRECTLY BONDED DIAMOND HEAT SINKS AND METHODS FOR MAKING SUCH STRUCTURES

(75) Inventors: Ralph Korenstein, Framingham, MA (US); Mary K. Herndon, Littleton, MA (US); Chae Doek Lee, Acton, MA (US)

(73) Assignee: Raytheon Company, Waltham, MA (US)

( * ) Notice: Subject to any disclaimer, the term of this patent is extended or adjusted under 35 U.S.C. 154(b) by 76 days.

(21) Appl. No.: 12/971,224

(22) Filed: Dec. 17, 2010

(65) Prior Publication Data

US 2012/0153294 A1    Jun. 21, 2012

(51) Int. Cl.
*H01L 29/15*    (2006.01)

(52) U.S. Cl.
USPC .. 257/76; 257/77; 257/E23.11; 257/E23.101; 257/E21.238; 257/E29.089; 257/E21.121; 438/479; 438/462

(58) Field of Classification Search
USPC ............ 257/76, 77, E23.111, E23.101, 257/E29.238, E29.089, E21.121; 438/479, 438/462
See application file for complete search history.

(56) References Cited

U.S. PATENT DOCUMENTS

| | | | |
|---|---|---|---|
| 6,400,742 B1 | 6/2002 | Hatakoshi et al. | |
| 6,946,363 B2 * | 9/2005 | Davidson | 438/455 |
| 7,015,117 B2 | 3/2006 | Urbanek | |
| 2003/0201492 A1 * | 10/2003 | Ravi | 257/328 |
| 2005/0202665 A1 * | 9/2005 | Namba et al. | 438/607 |
| 2006/0127672 A1 * | 6/2006 | Chrysler et al. | 428/408 |
| 2008/0303121 A1 | 12/2008 | Lin et al. | |
| 2009/0183784 A1 | 7/2009 | Merrell et al. | |
| 2010/0068503 A1 * | 3/2010 | Neogi et al. | 428/323 |
| 2010/0176705 A1 * | 7/2010 | Van Herpen et al. | 313/46 |
| 2011/0024767 A1 * | 2/2011 | Sung | 257/77 |

FOREIGN PATENT DOCUMENTS

| | | | |
|---|---|---|---|
| JP | 07-172989 | * | 11/1995 |
| JP | 2004022785 A | | 1/2004 |
| KR | 20070114218 A | | 11/2007 |
| WO | WO 2009/094537 A2 | | 7/2009 |

OTHER PUBLICATIONS

Francis et al.; "Formation and characterization of 4-inch GaN-on-diamond Substrates;" Diamond and Related Materials; vol. 19, issues 2-3; Feb.-Mar. 2010; available; on line Sep. 4, 2009; pp. 229-233.

(Continued)

*Primary Examiner* — Timor Karimy
(74) *Attorney, Agent, or Firm* — Daly, Crowley, Mofford & Durkee, LLP

(57) ABSTRACT

A semiconductor structure is bonded directly to a diamond substrate by Van der Waal forces. The diamond substrate is formed by polishing a surface of diamond to a first degree of smoothness; forming a material, such as diamond, BeO, GaN, MgO, or $SiO_2$ or other oxides, over the polished surface to provide an intermediate structure; and re-polishing the material formed on the intermediate structure to a second degree of smoothness smoother than the first degree of smoothness. The diamond is bonded to the semiconductor structure, such as GaN, by providing a structure having bottom surfaces of a semiconductor on an underlying material; forming grooves through the semiconductor and into the underlying material; separating semiconductor along the grooves into a plurality of separate semiconductor structures; removing the separated semiconductor structures from the underlying material; and contacting the bottom surface of at least one of the separated semiconductor structures to the diamond substrate.

18 Claims, 4 Drawing Sheets

(56) References Cited

OTHER PUBLICATIONS

Gila et al.; "Improved oxide passivation of AlGaN high electron mobility;" Applied Physics Letters 87, No. 163503; (2005); 3 sheets.

Kneissl et al.; "CW InGaN multiple-quantum multiple-quantum-well laser diodes on copper and diamond substrates by laser lift-off;" Materials Science and Engineering, B93 (2002); pp. 68-72.

Mavoori et al.; "Universal solders for direct and powerful bonding on semiconductors, diamond, and optical materials;" Appl. Physics Letters 78. 2976 (2001).

Oba et al.; "Growth of (111)—Oriented Diamond Grains on Hexagonal GaN:" Japanese Journal of Applied Physics 39 (2000) pp. L1213-L1215.

Wasserbauer et al.; "Progress toward the Processability of GaN-on-diamond wafers;" publication date is not available on INET; 4 sheets.

Yablonovitch et al; "Van der Waals bonding of GaAs epitaxial liftoff films onto arbitrary substrates;" Applied Physics Letters 58 (24); Jun. 11, 1990; pp. 2419-2421.

Group 4LABS, an Extreme Material Company; "How to process a GaN-on-diamond wafer" by The Management; Apr. 14, 2006; pp. 1-9.

U.S. Appl. No. 13/470,749, filed May 14, 2012.

* cited by examiner

SEMICONDUCTOR STRUCTURES HAVING DIRECTLY BONDED DIAMOND HEAT SINKS AND METHODS FOR MAKING SUCH STRUCTURES

TECHNICAL FIELD

This disclosure relates generally to semiconductors structures having directly bonded diamond heat sinks and methods for making such structures.

BACKGROUND

As is known in the art, diamond has been used as a heat spreader to remove the heat generated by high power semiconductor devices. Usually the diamond is bonded to the semiconductor chip via a metal solder or other adhesive. The semiconductor junction, where most of the heat is generated, is typically located a fair distance away from the diamond heat spreader and thus heat removal is not efficient. More particularly, processes have been developed for bonding GaN to diamond; however an interlayer is used between the GaN and the diamond. The interlayer is another thermal barrier that limits the ability of the diamond to effectively conduct heat away from the GaN epilayer. For example, in one method, a thin Si layer (~10-20 µm thick) is used as the interlayer and in another process an oxide "glue" layer ~10000 Å is used as the interlayer.

SUMMARY

In accordance with the disclosure, a semiconductor body is bonded directly to a diamond substrate. With such structure, heat removal from the semiconductor structure GaN is substantially improved.

In one embodiment the semiconductor body comprises a GaN epitaxial layer and wherein the epitaxial layer is directly bonded to the diamond substrate.

In one embodiment, a structure is provided comprising: a layer of diamond having a surface with peaks and valleys; and a second material disposed only in the valleys to provide the structure with a surface having: the peaks of the diamond layer; and, surface portions of the second material disposed in the valley.

In one embodiment, a second layer of semiconductor material bonded directly to the surface of the aforementioned structure.

In one embodiment, the major portion of the surface of the aforementioned structure is diamond.

In one embodiment, at least 80 percent of the surface of the aforementioned structure is diamond.

In one embodiment, the second material is diamond.

In one embodiment, the aforementioned second layer of semiconductor material is bonded directly to the surface of the structure by Van der Wall forces.

In one embodiment, the second material is a solid material.

In one embodiment, a structure is provided comprising: a layer of diamond and a second layer of semiconductor material bonded directly to the surface of the diamond.

In one embodiment, the semiconductor material is GaN.

In accordance with the disclosure, the GaN epitaxial layer is directly bonded to the diamond heat conductor using only Van De Waals forces which results in more efficient heat conduction away from the junction and improved heat dissipation.

In one embodiment, a method is provided for forming a structure, such method comprising: polishing a surface of diamond to a first degree of smoothness; forming a material over the polished surface to provide an intermediate structure; re-polishing the material formed on the intermediate structure to a second degree of smoothness smoother than the first degree of smoothness.

In one embodiment, the formed material is diamond.

In one embodiment, the formed material is a thermally conductive oxide.

In one embodiment, the formed material is BeO, GaN, MgO, or $SiO_2$.

In one embodiment, a method a method is provided for bonding a semiconductor to a heat sink, comprising: providing a structure comprising: a semiconductor layer having a bottom surface disposed on an underlying material; forming grooves through the semiconductor layer and into the underlying material; separating the semiconductor layer along the grooves into a plurality of separate semiconductor structures; removing the separated semiconductor structures from the underlying material; and contacting the bottom surface of at least one of the separated semiconductor structures to a heat sink.

In one embodiment, the semiconductor structures are GaN structures.

In one embodiment, the heat sink is diamond.

In one embodiment, the contacting is performed under a liquid.

In one embodiment the liquid is a volatile liquid.

In one embodiment the liquid is water.

In one embodiment the liquid evaporated after the contacting.

In on embodiment, the semiconductor structure is bonded to the diamond by Van der Waals forces.

In one embodiment, a method is provided for bonding a semiconductor to a diamond substrate, comprising: providing a structure comprising a GaN epitaxial layer having a bottom surface disposed on an underlying layer; forming grooves through the GaN and into the underlying layer; separating the GaN along the grooves into a plurality of separate structures; removing the separated GaN structures from the underlying layer; and contacting the bottom surface of at least one of the separated GaN structures to a diamond substrate.

Thus, with such disclosure, a semiconductor surface is bonded directly to diamond without the use of any adhesives or interlayer. Further, contacting between the GaN and diamond surface under water facilitates the formation of strong Van der Waals bonding.

The details of one or more embodiments of the disclosure are set forth in the accompanying drawings and the description below. Other features, objects, and advantages of the disclosure will be apparent from the description and drawings, and from the claims.

DETAILED DESCRIPTION

Figure 1:
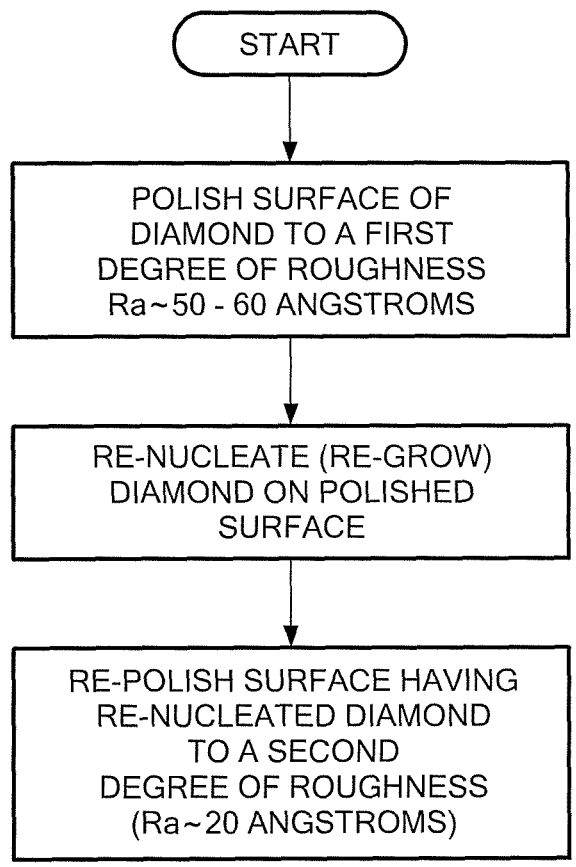
FIG. 1 is a diagram showing steps in a process used to form a diamond substrate in accordance with the disclosure.
Figure 1A:
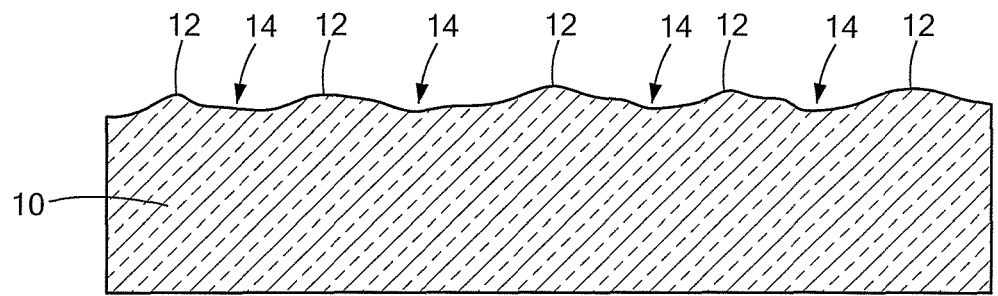
FIGS. 1A-1C are sketches of the diamond substrate at various stags in the fabrication thereof.

Referring now to FIG. 1, a process is shown for forming a diamond heat sink. First, a first diamond body 10 (FIG. 1A) is formed using, for example, any conventional plasma deposition process. The upper surface of the first diamond body 10 is polished using a conventional diamond suspension process, here polished to a degree of smoothness in the order of an Ra of between approximately 50-60 Angstroms. It is noted that even after the polishing, the upper surface of the body has peaks 12 and valleys 14.

Figure 1B:
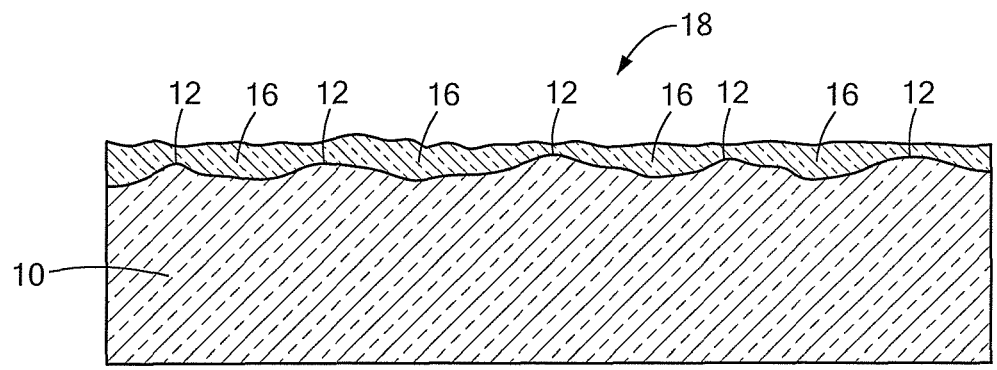

Next, material 16 (FIG. 1B), here for example, additional diamond is grown on the polished diamond using the same plasma deposition process used to form the first diamond body 10, thereby forming a second diamond body 18. More particularly, the additional diamond is formed by re-nucleation. This is performed by bias enhanced nucleation (BEN). Thus, the process does not merely grow more diamond on top of the structure 12 but rather takes advantage of diamond re-nucleation to allow additional diamond to grow everywhere on the polished diamond surface including inside voids and crevices.

Figure 1C:
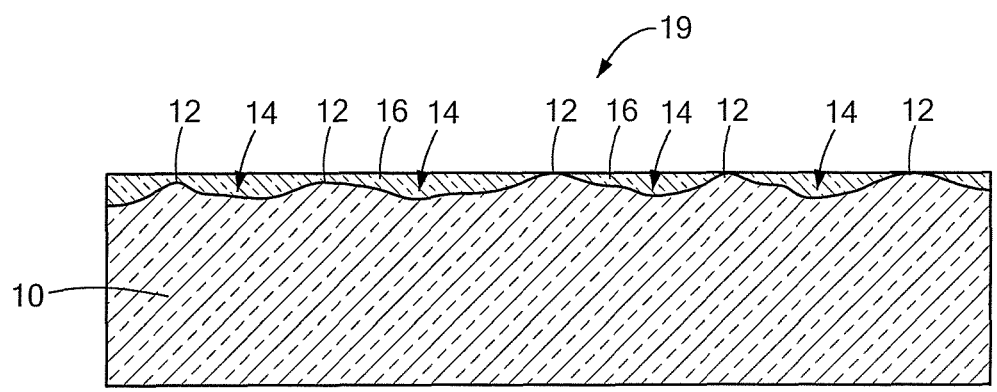

Next, the upper surface of the body 18 (FIG. 1B) is re-polished to a second degree of smoothness (here for example, to an Ra of approximately 20 Angstroms) smoother than the first degree of smoothness to form body 19 (FIG. 1C). The resulting surface is an optically polished surface. It is noted that the additional material 16 may be, for example, BeO, GaN, MgO, or $SiO_2$ or other oxides with reasonable thermal conductivity. Thus, the structure 19 comprises a layer of diamond 10 having a surface with peaks 12 and valleys 14 and the second material 16 disposed only in the valleys 14 to provide the structure 19 with a surface having: the peaks 12 of the diamond layer 10 and, surface portions of the second material 16 disposed in the valleys 14. Here, at least 80 percent of the surface is the peaks 12.

Figure 2:
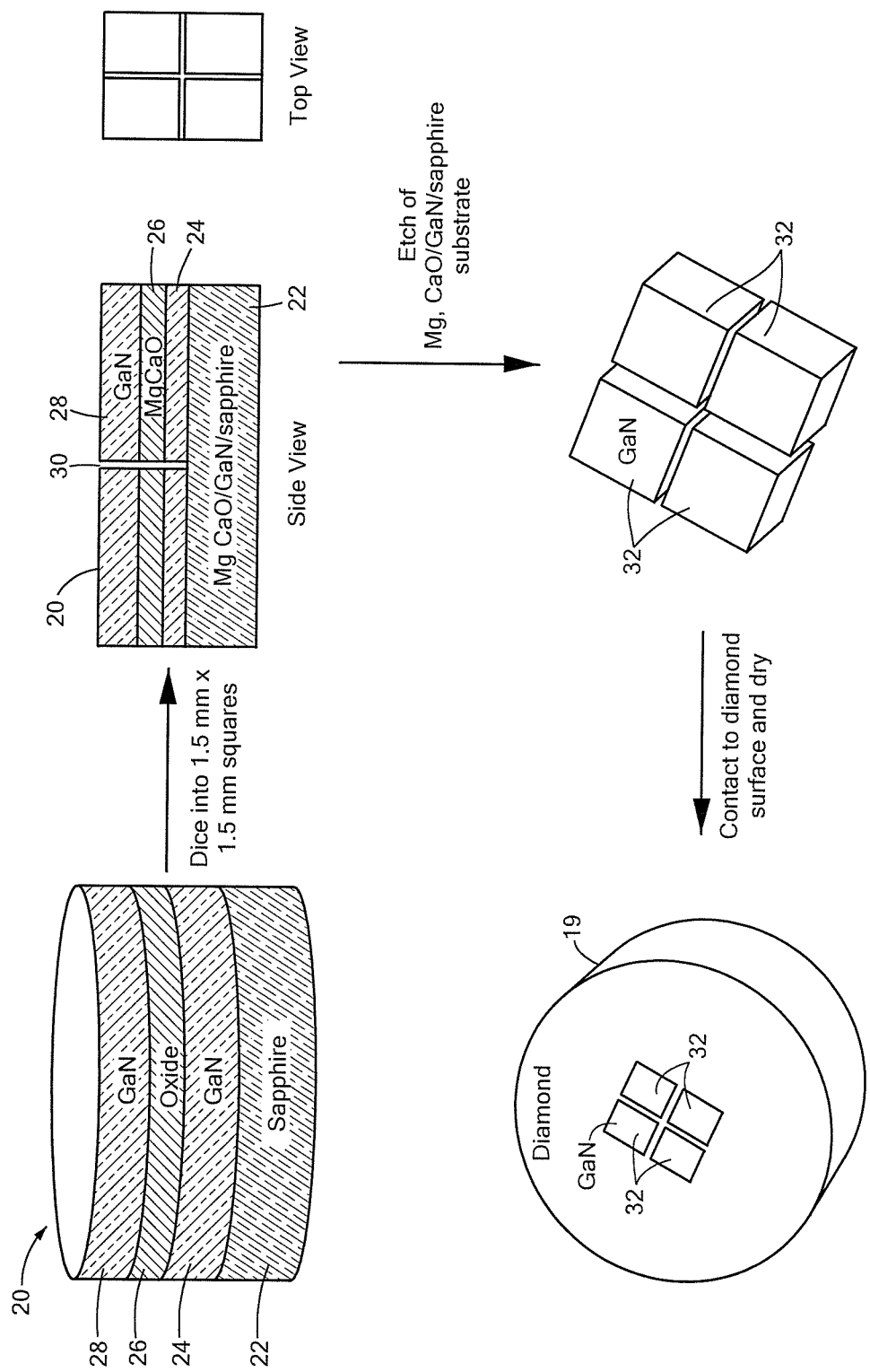
FIG. 2 is a diagram showing steps in a process used to bond a semiconductor directly to the diamond substrate formed in accordance with the process steps of FIG. 1 in accordance with the disclosure.

Next, referring to FIG. 2, a process is shown for directly bonding a semiconductor to the optically polished upper surface of the body 19 by Van der Waals forces. First, a composite substrate 20 is provided having a lower layer 22 of sapphire, a 2.5 micrometers thick layer 24 of GaN on the sapphire 22, a (Mg,Ca)O layer 26, here 0.3 to 0.5 micrometers thick, and a second, upper, epitaxially formed (1 to 5 micrometers thick) layer 28 of GaN on the (Mg,Ca) O layer 26. The substrate 20 may be purchased from the University of Florida, Gainesville, Fla., see a paper entitled "Improved oxide passivation of AlGaN/GaN high mobility transistors" by Gila et al. Applied Physics Letters 87, 1635303 (2005).

More particularly, a handle wafer, not shown, which could be Silicon or glass, is bonded with glue to the top of the GaN layer 28. Next, grooves 30 are mechanically cut with a saw blade through the semiconductor layer 28 and through layer 26 into layer 24, as shown. Next, a dilute (10%) phosphoric acid solution is used to separate the semiconductor layer 28 into a plurality of separate semiconductor structures 32. More particularly, the etch undercuts under the lower surface of the epitaxial layer 28 and along the interface between the epitaxial layer 28 and the (Mg,Ca)O layer 26 thereby separating (i.e., removing) the separated semiconductor structures 32 from the underlying material, i.e., layer 26. Here, the separated structures 32 are small squares ~2 mm×2 mm to facilitate (i.e., reduce the etching time) in the undercutting by the phosphoric acid—otherwise it would take a very long time for the acid to work its way through large areas.

Figure 3:
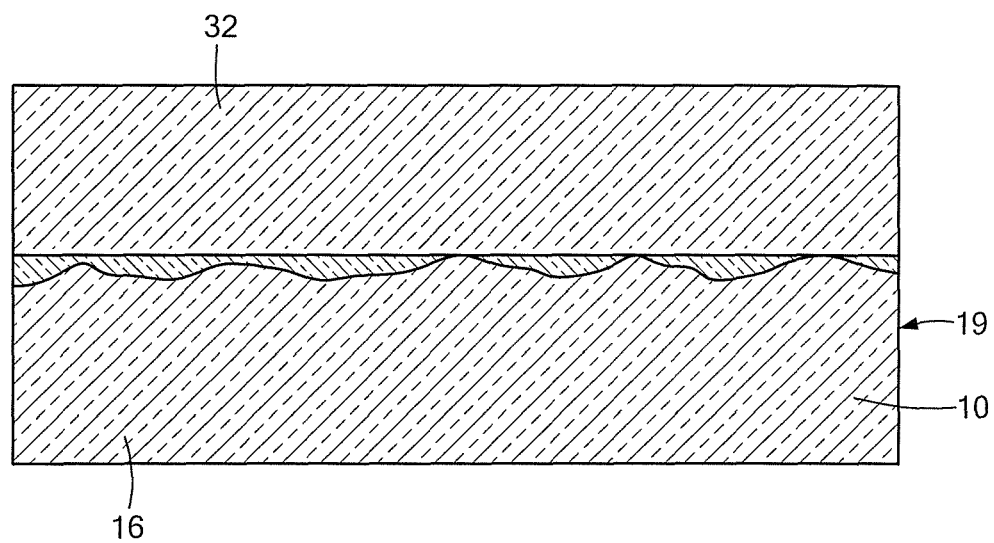
FIG. 3 is a sketch of the diamond substrate directly bonded to the semiconductor.

Next, the bottom surfaces of the separated semiconductor structures 32 are contacted to the smoothed upper surface of the diamond structure 19 formed in accordance with the process described above in connection with FIG. 1. It is noted that the bottom surface of the structures 32 and the upper surface of structured 18 are brought together under water. Alternatively, a few water droplets are placed between the surfaces to be bonded. Next, the handle is then removed after attachment to diamond is complete. Any remaining water being evaporated resulting in a bond process wherein Van der Waals attractive forces are developed between optically contacted (i.e., extremely smooth) surfaces. The resulting bonded structure is shown in FIG. 3. Once the bonding steps are completed the handle wafer is removed from the top of the GaN layer 28 by means of organic solvents.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A structure comprising: a layer of diamond having an irregular surface with peaks and valleys formed after a polishing process, a second material disposed in the valleys to provide the structure with an upper surface having: at least one of the peaks of the diamond layer in contact with the upper surface; and, surface portions of the second material disposed in the valleys; and including a second layer of semiconductor material bonded directly to the upper surface of the structure.

2. The structure recited in claim 1 wherein a major portion of the upper surface of the structure is diamond.

3. The structure recited in claim 2 wherein at least 80 percent of the upper surface of the structure is diamond.

4. The structure recited in claim 1 wherein the second material is diamond.

5. The structure recited in claim 1 wherein the second layer of semiconductor material is bonded directly to the upper surface of the structure by Van der Waal forces.

6. The structure recited in claim 1 wherein the second material is a solid material.

7. A method for forming a structure, such method comprising:
    polishing a surface of diamond to a first degree of smoothness having an irregular surface with peaks and valleys;
    forming a material over the polished surface to provide an intermediate structure;
    forming an upper surface on the intermediate surface, the upper surface having:
        at least one of the peaks of the diamond layer in contact with the upper surface; and,
        surface portions of the material disposed in the valleys, comprising polishing the material formed on the intermediate structure to a second degree of smoothness smoother than the first degree of smoothness.

8. The method recited in claim 7 wherein the formed material is diamond.

9. The method recited in claim 7 wherein the formed material is a thermally conductive oxide.

10. The method recited in claim 7 wherein the formed material is BeO, GaN, MgO, or $SiO_2$.

11. The method recited in claim 7 including bonding a semiconductor layer directly to the upper surface.

12. The method recited in claim 7 including bonding a semiconductor layer directly to the upper surface using Van der Waal forces.

13. A structure comprising: a layer of diamond having an irregular surface with peaks and valleys, a first portion of the peaks being higher than a second portions of the peaks; a second material disposed in the valleys and over said second portions of the peaks to provide the structure with an upper surface having: the first portion of at least one of the peaks of the diamond layer in contact with the upper surface; and, surface portions of the second material disposed in the valleys; and including a second layer of semiconductor material bonded directly to the upper surface.

14. The structure recited in claim 13 wherein the major portion of the upper surface is diamond.

15. The structure recited in claim 13 wherein at least 80 percent of the upper surface is diamond.

16. The structure recited in claim 13 wherein the second material is diamond.

17. The structure recited in claim 13 wherein the layer of semiconductor material is bonded directly to the upper surface by Van der Waal forces.

18. The structure recited in claim 13 wherein the second material is a solid material.

\* \* \* \* \*

UNITED STATES PATENT AND TRADEMARK OFFICE
CERTIFICATE OF CORRECTION

| | | |
|---|---|---|
| PATENT NO. | : 8,698,161 B2 | Page 1 of 1 |
| APPLICATION NO. | : 12/971224 | |
| DATED | : April 15, 2014 | |
| INVENTOR(S) | : Ralph Korenstein et al. | |

It is certified that error appears in the above-identified patent and that said Letters Patent is hereby corrected as shown below:

Title Page, item (75), Inventor name delete "Chae Doek Lee" and replace with --Chae Deok Lee--.

Signed and Sealed this
Second Day of December, 2014

Michelle K. Lee
*Deputy Director of the United States Patent and Trademark Office*